United States Patent [19]

Eschler

[11] 3,998,521
[45] Dec. 21, 1976

[54] LINEAR DATA INPUT TRANSDUCER

[75] Inventor: Hans Eschler, Munich, Germany

[73] Assignee: Siemens Aktiengesellschaft, Berlin & Munich, Germany

[22] Filed: Dec. 15, 1975

[21] Appl. No.: 640,785

[30] Foreign Application Priority Data

Dec. 19, 1974 Germany ............. 2460218

[52] U.S. Cl. .................. 350/3.5; 350/161 R
[51] Int. Cl.² ................. G07B 27/00
[58] Field of Search ...... 350/3.5, 161; 95/4.5 R; 346/107

[56] References Cited

UNITED STATES PATENTS 3,653,067  3/1972  Anderson et al. .............. 350/3.5
3,703,137  11/1972  Anderson et al. .............. 350/3.5

*Primary Examiner*—William L. Sikes
*Attorney, Agent, or Firm*—Hill, Gross, Simpson, Van Santen, Steadman, Chiara & Simpson

[57] ABSTRACT

A linear data input transducer for modulating an object beam from a laser which is subsequently projected along with a reference beam onto a storage medium to holographically record data characterized by the transducer having a first acousto-optical light deflector for deflecting the object beam in a first direction, a second acousto-optical light deflector for deflecting the beam in a second direction, each of the first and second deflectors having sound waves extending at right angles to each other, and a device for applying a signal input to each deflector which includes a chain of high frequency oscillators which are independently actuated and an adder circuit for combining the output of the oscillators into the signal input. In one embodiment of the invention, the transducer has a single acousto-optical cell with the sound transducers disposed on the surface extending at right angles so that the transducer is a compact light deflector. In another embodiment, the transducer is composed of two separate cells which are aligned with the second light deflector receiving the beams deflected by the first light deflector.

10 Claims, 5 Drawing Figures

LINEAR DATA INPUT TRANSDUCER

BACKGROUND OF THE INVENTION

1. Field of the Invention

The present invention is directed to a linear data input transducer for use in a holographic data storage system and the system. The system comprises a laser generating a laser beam, a beam divider which splits the beam from the laser into an object beam and a reference beam, the transducer which is arranged in the path of the object beam to spatially modulate the object beam with the information to be modulated thereon and a holographic plate on which both the reference beam and the modulated object beam are projected to record the holographic information.

2. Prior Art

Linear acousto-optical data input transducers for high speed data input into a holographic storage system are known and discussed in an article printed in *Proceedings of the Electro-Optical Systems Design Conference*, New York, September 18–20, 1973, pages 90–101. As disclosed in this article, a piezo-electric transducer of an acousto-optical modulator receives the information, which is to be stored, in the form of pulse modulated high-frequency signals in a serial fashion. The piezo-electric transducer creates a correspondingly modulated high frequency ultrasonic wave which passes through the modulator at the speed of sound. As soon as the entire modulated sound wave fills the aperture of the modulator, the modulator is illuminated with an extremely short laser pulse and during the duration of the laser pulse, the sound wave is virtually not moving. The pattern of the sound wave causes a diffraction of the laser beam. The spatially modulated, first optical order of diffraction of the laser beam is focused by a lens onto the part of the storage tape or medium on which the recording is to be made. A disadvantage with the above described data transducer and recording system is that it requires a laser having a pulse in the order of a nano-second pulse.

SUMMARY OF THE INVENTION

The aim of the present invention is to provide a high speed, linear data input transducer which can be illuminated with a CW laser and can be operated at low controlled powers. To accomplish this aim, the linear data input transducer is used in a system for holographically recording data with the system comprising a laser providing a laser beam, a beam divider means for splitting the laser beam into an object beam and a reference beam, a linear data input transducer disposed in the path of the object beam for spatially modulating the object beam with items of information to be recorded, and a hologram storage medium on which the reference beam and the modulated object beam are directed to record the data in holographic form. The linear data input transducer which is an improvement in the system for holographic recording data comprises a first means for acousto-optically deflecting the laser beams into a plurality of beams extending in a first direction; second means for acousto-optically deflecting the beams into a plurality of beams extending in a second direction; each of said first and second means having means creating sound waves with the sound waves of the first means extending at right angles to the sound waves of the second means; and the means for applying a signal input to both of the means for creating the sound waves, said means for applying including a chain of high frequency oscillators which are independently actuated and an adder circuit for combining the output of the oscillators into a signal input. Each of the high frequency oscillators can be switched on independently of one another or they may also be independently modulated in an analogue manner.

The two acousto-optical light deflectors are operated by the same high-frequency signal which may be formed of a plurality of different frequencies. Therefore, the two sound mediums of the deflectors are traversed by sound waves which are produced by adding signals of many frequencies and the beams passing through each of the mediums is diffracted into a plurality of beams extending at different angles along the direction. The movement of the acoustical diffraction lattice also produces a displacement of the light frequencies of the diffracted light beams by precisely these operating frequencies. This means that during the operation of an acousto-optical light deflector with $n$ oscillators, $n$ light beams with $n$ different light frequencies are formed.

When the second acousto-optical light deflector is operated with the same signal, the $n$ light beams, which have already been produced by the first light deflector, are diffracted in a second direction which is perpendicular to the first direction. This gives rise to a two-dimensional light spot array having $n \times n$ spots with all the spots being of a different light frequency.

On account of the small line width of the gas lasers, which are generally used and which have an order of magnitude of 1 KHz, only the diffracted object beams, which have a light frequency which is the same as the light frequency of the reference beam, are capable of interference with the reference beam to form the hologram. Thus, when the light deflectors are operated with their frequency, $f_i$, the object beams which are capable of interference with the reference beam are those object beams which were diffracted into a positive first order of diffraction by the first light deflector and in the second light deflector were diffracted into a negative first order of diffraction or vice versa.

All of the light spots of the two-dimensional array, which are located in the main diagonals directed toward the zeroth order, fulfill the given condition, which is that their light frequencies are equal and also agree with the light frequency of the reference beam. Thus, the doppler shift in the light frequencies of each spot which was caused by passing through the first light deflector are completely compensated by the doppler shift in the light frequency in the opposite direction which was caused by the second light deflector.

The amount of deflection of the light beams in the direction is produced by connecting and disconnecting the different high frequency oscillators. Thus, the holographic plate has recorded thereon an interference pattern, which during reconstruction, produce an oblique, linear chain of spots. This chain of spots has a position for each of the oscillators with the presence of a spot being dependent upon the operative signal of the given oscillator. Thus, a light spot will occur at a given position when a given oscillator is on and a vacancy or gap will occur at the given position when the particular oscillator is off.

As a result of the use of the two light deflectors, a greater distance exists between the light spots located in the diagonal of the light spot arrays than exists between the positions in either of the first or second directions of deflection. This greater distance causes the resolution of the data input transducer to be increased by a factor of $\sqrt{2}$ over the resolution in the data input transducer having only one light deflector. A linear data input transducer of this type possesses a data rate of between 10 and 100 M bits/s. The number of high frequency oscillators which may be connected in the control circuit can amount to over 200. Also, the data input transducer can be constructed from commercially available acousto-optical modulators.

In one embodiment of the data input transducer, each light deflector is separate with the second deflector being aligned to receive the deflected beams from the first deflector. In another embodiment, the first and second acousto-optical light deflectors are combined to form one single light deflector cell, which provides a compact linear data input transducer. For this purpose, the two electrical sound transducers are arranged on two surfaces of the sound medium forming the cell which surfaces extend at right angles to one another. These sound transducers will produce two intersecting sound waves. When the two sound transducers are operated with the same high-frequency signal, an irradiated light wave is diffracted into the same directions as it would be in the case of two acousto-optical light deflectors arranged in series.

The laser used in the holographic recording system can be any commercially available CW gas laser.

In order to block or gate out all light beams other than these located in the diagonal of the spot array, a diaphragm may be arranged in the path of the modulated beams as it leaves the transducer to block all light beams other than those arranged on the diagonal to the directions of deflection.

In the holographic recording system of the present invention, the data input transducer is capable of modulating the optical beams with both analogue and digital information. This is accomplished by the fact that the oscillators can be actuated by being connected or disconnected independently of one another but can also be analogue modulated. Thus, the transducer is also suitable for holographic recording of analogue information.

DESCRIPTION OF THE PREFERRED EMBODIMENTS

Figure 1:
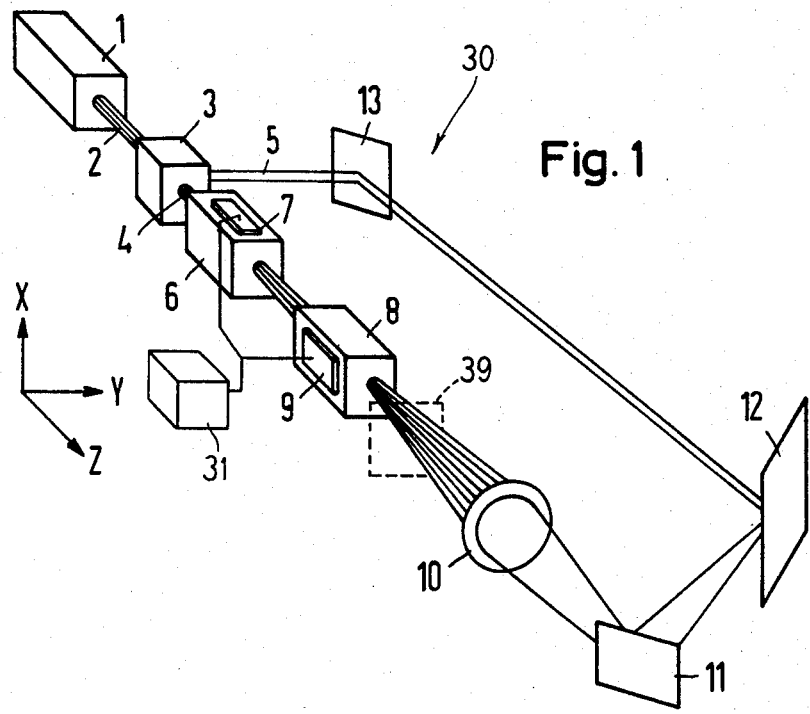
FIG. 1 is a perspective view of a linear acousto-optical data input transducer used in a holographic recording system in accordance with the present invention.

The principles of the present invention are particularly useful in a system generally indicated at 30 in FIG. 1 for holographically recording data.

The system 30 includes a gas laser 1, which provides a laser beam 2 that is received by a beam divider 3 and split into an object beam 4 and a reference beam 5. The object beam 4 is received by the linear data input transducer which is illustrated as comprising two acousto-optical light deflectors 6 and 8 which are arranged in series along the path of the beam 4. The object beam 4 passes through the sound medium of the deflector 6 which has a sound transducer 7 which receives simultaneously a plurality of equidistant oscillating frequencies which are in a range of between 50 and 90 MHz.

The sound waves moving in the sound medium deflect the object beam 4 into a plurality of beams having different angles along a first direction. These deflected light beams are received by the sound medium of the second acousto-optical light deflector 8 which has the sound transducer 9. In the sound medium of the second deflector 8, the sound waves move at a right angle to the direction of the movement of the sound waves moving in the first sound medium. Thus, the deflected beams received in the second deflector are each deflected into a plurality of beams having different angles along the second direction which is at right angle to the direction of deflection to the first deflector 6. The light beams emerging from the second acousto-optical deflector 8 pass through a lens 10 as an array of light spots which are diagrammatically illustrated or shown in FIG. 4. From the lens 10, the beams are projected onto a reflector 11 which reflects the beams onto a holographic recording medium or plate 12. The reference wave or beam 5 has been reflected or directed by a reflector 13 at the recording medium or plate 12 to interfere with the object waves to holographically record the information thereon.

Both of the transducers 7 and 9 are piezo-electric transducers which receive the same input signal from a control electronic 31. As the operating frequency of the input signal changes, the transducers 7 and 9 create different sound wave patterns, which transducers 7 and 9 create different sound wave patterns, which are the same in the medium of the deflectors 6 and 8 but at right angles to each other. These patterns cause the deflected light beams to possess different light frequencies. Thus, not all of the beams which have been deflected by the light deflectors, can interfere with the reference beam 5 which is being projected on the holographic storage medium 12.

The control electronics 31 includes a chain of $n$ oscillators 14 with the frequencies $f_1, f_2, f_3, \ldots f_n$. These oscillators 14 together with a shift register 15 are connected to $n$ switching gates 16. The output signal of the $n$ high frequency oscillators 14 passing through the gates 16 are added by an adder circuit 17 and conducted to the sound transducers 7 and 9. The high frequency oscillators 14 are able to be modulated independently of one another. By switching specific oscillators on and off, it is possible to project and not project the beam associated with a given frequency.

To produce a uniform brightness in all of the beam directions, it is possible to compensate the generally frequency dependent deflection efficiency for each beam position. This is accomplished by a suitable dimensioning of the adder 17.

Figure 2:
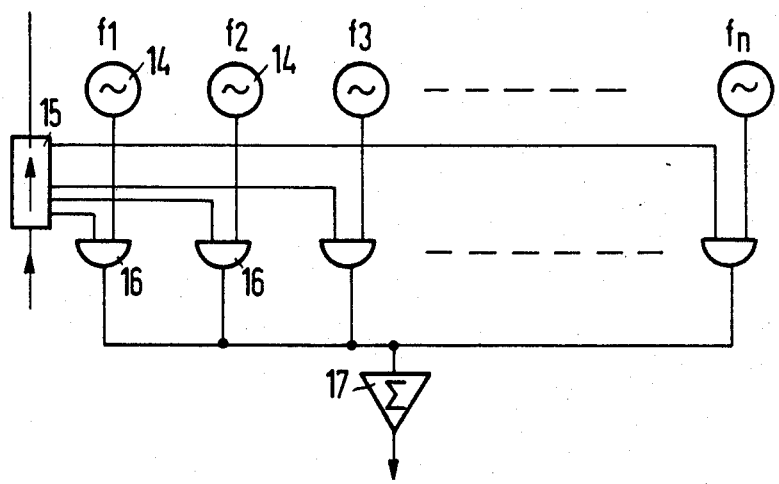
FIG. 2 is a circuit diagram for the electronic operation of the data transducer.
Figure 3:
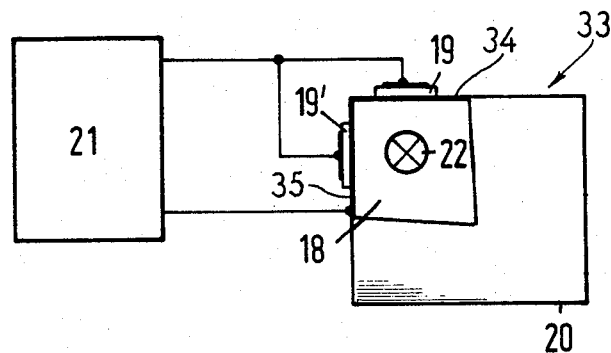
FIG. 3 is an end view of an embodiment of a compact light deflector cell for a transducer in accordance with the present invention.

In the system 30, the linear data input transducer utilized two light deflectors 6 and 8 which were arranged in series along the direction or the path of the object beam 4. An embodiment of the linear data input transducer is illustrated in FIG. 3 and generally indicated at 33. This embodiment consists of one single compact deflection cell instead of the two deflectors 6 and 8. This compact cell contains a sound medium 18 which has a surface 34 that receives piezo-electric sound transducer 19. The sound medium 18 has a second surface 35 that extends at right angles to the surface 34. A second piezo-electric sound transducer 19' is disposed on the surface 35. The two sides of the sound medium 18, which sides are opposite sides 34 and 35, are engaged by a sound absorber 20. The sound transducers 19 and 19' are operated by a control electronics 21 which include the components illustrated in FIG. 2 and which applies the same operating signal to both of the transducers 19 and 19'. A laser beam 22, which is passed through the sound medium 18, is diffracted in such a manner that a two-dimensional array of laser beam directions is simultaneously formed. The compact, acousto-optical cell 33 thus replaces the two light deflectors 6 and 8 in the embodiment illustrated in FIG. 1.

The mode of operation of the linear data input transducer will be described making reference to FIGS. 4 and 5.

Figure 4:
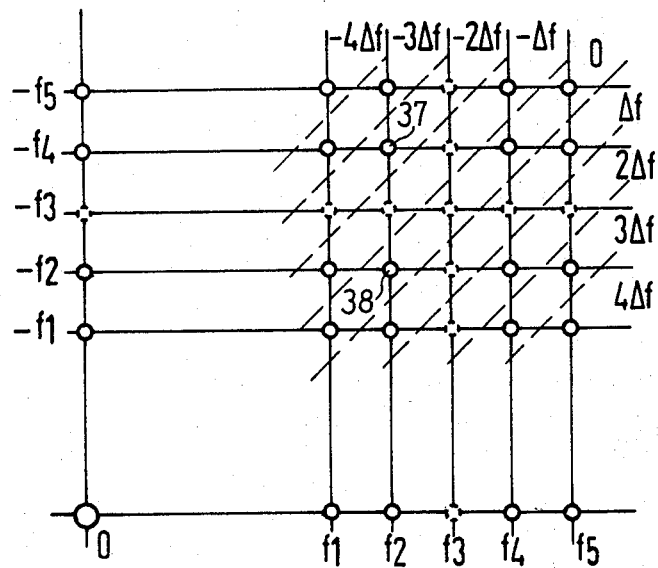
FIG. 4 is a diagrammatic illustration of a light spot array produced in accordance with the invention.
Figure 5:
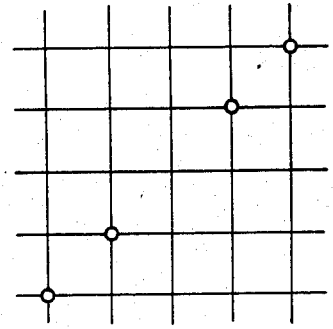
FIG. 5 is a diagrammatic illustration of a reconstruction image of a hologram recorded in accordance with the present invention.

In FIG. 4, a portion of a light spot array is illustrated to show the position of the spots which will be produced by the two acousto-optical modulators 6 and 8 when they receive an input signal from the electronic control 31 which has a chain of five high frequency oscillators with frequencies $f_1$ through $f_5$. The difference between each frequency is the same amount so that the difference between $f_1$ and $f_2$ is the same as the difference between $f_2$ and $f_3$. In the particular illustration of FIG. 4, only the oscillators producing the frequencies $f_1$, $f_2$, $f_4$ and $f_5$ are actuated so that the beam positions or light spot positions produced by diffracting beams by a frequency produced by the oscillator $f_3$ do not occur although these positions are illustrated in broken lines.

The portion of the array illustrated is for the beams which were diffracted in a positive first order by one of the two modulators 6 and 8 and in a negative first order by the other modulator. As mentioned above, as a result of the movement of the ultrasonic grid, a majority of the beams possess a light frequency shift which is displaced by a particular sound frequency $f_i$, and therefore can no longer interfere with the reference beam 5. As illustrated, the amount of frequency shift of the light frequency of the beams deflected to their respective position is indicated as an integral number of $\Delta f$ and may be either a positive or a negative shift. Thus, for example, a beam producing a light spot 37 which is produced by the frequency $f_2$ causing a positive first order of diffraction and the frequency $f_4$ producing a negative first order of diffraction, has a frequency shift $-2 \Delta f$. In a similar manner, a beam produced by a positive first order and a negative second order for the same frequency such as $f_2$ will produce a light spot 38 and has a zero frequency shift. The light spot 38 will lie on a diagonal extending to the zeroth order. Thus, the only light spots which are produced by beams having no frequency shift in their light frequency are those spots which lie in a diagonal row from the zeroth order. These beams are the only ones which are capable of interferring with the reference beam 5 to form a holographic recording.

As mentioned above, the oscillator producing the frequency $f_3$ was in an off position and no beams are deflected to produce light spots in the position that corresponds to the frequency $f_3$. Thus, a holographic recording of the array of light spots illustrated in FIG. 4 would record only four spots with a gap appearing at the position for the frequency $f_3$. A reconstruction of a recorded hologram of the array of FIG. 4 would produce a group of light spots extending along a diagonal as illustrated in FIG. 5 with a vacancy or gap appearing at the point for the frequency $f_3$.

Although the linear data input transducer of the present invention forms a two-dimensional light spot array, only a line of light spots extending at a diagonal is holographically recorded on the storage medium 12.

Since it would be desirable to prevent the beams, which have a frequency shift from being projected on the reflector 13 and storage plate 12, the system 30, whether it is utilizing the two separate deflectors or the single compact deflector, may be provided with means to block the undesirable light beam leaving the transducer. For example, a diaphragm such as partition 39 illustrated in broken lines in FIG. 1, having an aperture of the desired configuration may be provided for the purpose to prevent further propagation of those light beams which do not fall on the desired diagonal.

Although various minor modifications may be suggested by those versed in the art, it should be understood that I wish to employ within the scope of the patent granted hereon, all such modifications as reasonably and properly come within the scope of my contribution to the art.

I claim:

1. A linear data input transducer for use in a system for holographically recording data, said system comprising a laser providing a laser beam, beam divider means for splitting the laser beam into an object beam and a reference beam, a linear data input transducer disposed in the path of the object beam for spatially modulating the object beam with items of information to be recorded, and a hologram storage medium on which the reference beam and the modulated object beam are directed to record the data in holographic form, said linear data input transducer comprising a first means for acousto-optical deflecting the object beam into a plurality of beams extending in a first direction; second means for acousto-optical deflecting object beams into a plurality of beams extending in a second direction, each of said first and second means having means creating sound waves with the sound waves of the first means extending at right angles to the sound wave of the second means so that the first direction is at a right angle to the second direction; and means for applying a signal input to both of the means for creating the sound waves, said means for applying including a chain of high frequency oscillators, which are independently actuated, and an adder circuit for combining the output of the oscillators into a signal input.

2. A linear data input transducer according to claim 1, wherein the laser of the system is a narrow band laser.

3. A linear data input transducer according to claim 1, which includes means disposed across the path of the deflected beams as they leave the transducer for blocking all light beams other than those arranged on a diagonal to both the first and second directions of deflection.

4. A linear data input transducer according to claim 1, wherein the first and second means for acousto-optically deflecting are disposed on a single deflector cell so that the transducer is a compact light deflector.

5. A linear data input transducer according to claim 1, wherein the first and second means are separate deflecting cells, with the cell of the second means being aligned for receiving the beams deflected by the first means.

6. A system for holographically recording data comprising a laser providing a laser beam, beam divider means for splitting the laser beam into an object beam and a reference beam, means for directing the reference beam onto a hologram storage medium, a linear data input transducer disposed in the path of the object beam for spatially modulating the object beam with items of information to be recorded, said modulated beam being directed on the hologram storage medium to interfere with the reference beam to record the data in a holographic form, the improvements comprising said linear data input transducer comprising a first means for acousto-optically deflecting the object beam into a plurality of beams extending in the first direction; second means for acousto-optically deflecting the object beams into a plurality of beams extending in the second direction, each of said first and second means having means creating sound waves with the sound waves of the first means extending at right angles to the sound waves of the second means; and means for applying a signal input to both of the means for creating sound waves, said means for applying including a chain of high frequency oscillators, which are independently actuated, and an adder circuit for combining the output of the oscillators into a signal input, said second means compensating for frequency shift in the object beam due to deflection by the first means so that all the light portions capable of interference with the reference beam extend in a row which is diagonal to the first and second directions.

7. A system for holographically recording data according to claim 6, wherein the laser of the system is a narrow band laser.

8. A system according to claim 6, which includes means disposed across the path of the deflected beams as they leave the transducer for blocking all light beams other than those beams arranged on the diagonal to the first and second directions of deflection.

9. A system according to claim 6, wherein the first and second means for acousto-optically deflecting are disposed on a single deflector cell so that the transducer is a compact light deflector.

10. A system according to claim 6, wherein the first and second means are separate deflector cells arranged with the second cell receiving the beams deflected by the cell of the first means.

* * * * *